United States Patent
Hsu et al.

(10) Patent No.: US 7,378,308 B2
(45) Date of Patent: May 27, 2008

(54) CMOS DEVICES WITH IMPROVED GAP-FILLING

(75) Inventors: Ju-Wang Hsu, Taipei (TW); Chih-Hsin Ko, Fongshan (TW); Jyu-Horng Shieh, Hsin-Chu (TW); Baw-Ching Perng, Hsinchu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/393,369

(22) Filed: Mar. 30, 2006

(65) Prior Publication Data

US 2007/0235823 A1 Oct. 11, 2007

(51) Int. Cl.
*H01L 21/8238* (2006.01)
(52) U.S. Cl. .................. 438/231; 438/595; 438/981; 257/E21.64
(58) Field of Classification Search .............. 438/218, 438/230, 231, 232, 233, 595, 938, 981; 257/E21.64, 257/E21.641
See application file for complete search history.

(56) References Cited

U.S. PATENT DOCUMENTS

| 6,156,598 | A | * | 12/2000 | Zhou et al. | 438/231 |
| 6,849,546 | B1 | | 2/2005 | Tu et al. | |
| 7,220,630 | B2 | * | 5/2007 | Cheng et al. | 438/199 |
| 2006/0157795 | A1 | * | 7/2006 | Chen et al. | 257/369 |

OTHER PUBLICATIONS

Nakahara et al., "A Robust 65-nm Node CMOS Technology for Wide-range Vdd Operation", 2003 IEEE, pp. 11.2.1-11.2.4.*

* cited by examiner

*Primary Examiner*—Chandra Chaudhari
(74) *Attorney, Agent, or Firm*—Slater & Matsil, L.L.P.

(57) ABSTRACT

A semiconductor structure includes a substrate, and a first MOS device on the first region of the substrate wherein the first MOS device includes a first spacer liner. The semiconductor structure further includes a second MOS device on the second region wherein the second MOS device includes a second spacer liner. A first stressed film having a first thickness is formed over the first MOS device and directly on the first spacer liner. A second stressed film having a second thickness is formed over the second MOS device and directly on the second spacer liner. The first and the second stressed films may be formed of a same material.

12 Claims, 11 Drawing Sheets

FIG. 15B

CMOS DEVICES WITH IMPROVED GAP-FILLING

TECHNICAL FIELD

This invention relates generally to semiconductor devices, and more particularly to structures and manufacturing methods of metal-oxide-semiconductor (MOS) devices with improved gap-filling and contact etch process window.

BACKGROUND

The scaling of VLSI circuits is a constant effort. Smaller integrated circuits allow more devices to be formed in one semiconductor chip. Additionally, power consumption and performance are also improved. With circuits becoming smaller and faster, improvement in device driving current is becoming more important, which can be increased by improving carrier mobility. Among efforts made to enhance carrier mobility, forming a stressed channel region is a known practice. The performance of a MOS device can be enhanced through a stressed-surface channel. This technique allows performance to be improved at a constant gate length without adding complexity to circuit fabrication or design.

Research has revealed that a bi-axial, in-plane tensile stress field can improve NMOS performance, and a compressive stress parallel to the channel length direction can improve PMOS device performance. A commonly used method for applying stress to the channel region is forming a stressed contact etch stop layer (CESL) on a MOS device. The stressed CESLs introduce stress into the channel region. Therefore, the carrier mobility is improved. Typically, thick CESLs are preferred as thicker CESLs apply greater stresses in the channel regions of MOS devices.

Figure 1:
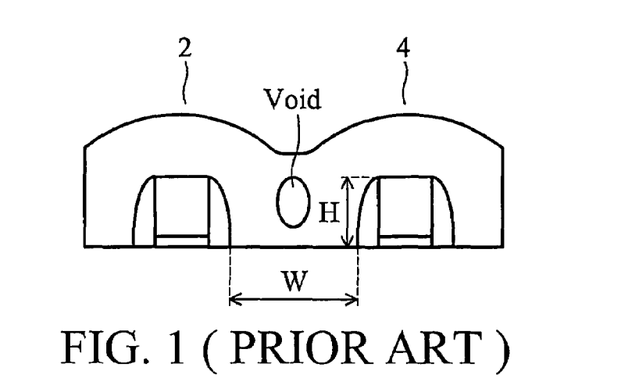
FIG. 1 illustrates a void formed in a contact etch stop layer.

With the scaling of integrated circuits, however, such a method encounters a problem. When devices become smaller, the distance between devices decreases. The subsequently performed gap-filling and contact etch processes suffer problems accordingly. The gap-filling problem may be explained using FIG. 1. A gap forms between two neighboring MOS devices 2 and 4, and the aspect ratio of the gap may be defined as the ratio of height H to width W. With a high aspect ratio for the gap, voids may be formed during the subsequent formation of an inter-layer dielectric layer. The voids may cause difficulty in subsequent processes, and may cause problems, such as short circuits, if the voids are filled with conductive materials.

Figure 2A:
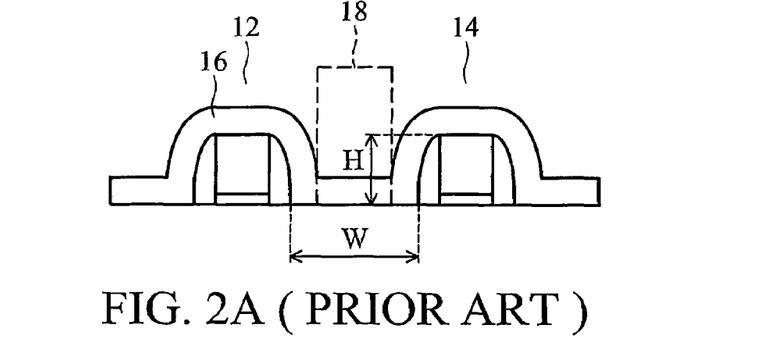
FIGS. 2A and 2B illustrate how the etching process window of a contact etch stop layer reduces with the decrease of the distance between two neighboring MOS devices.
Figure 2B:
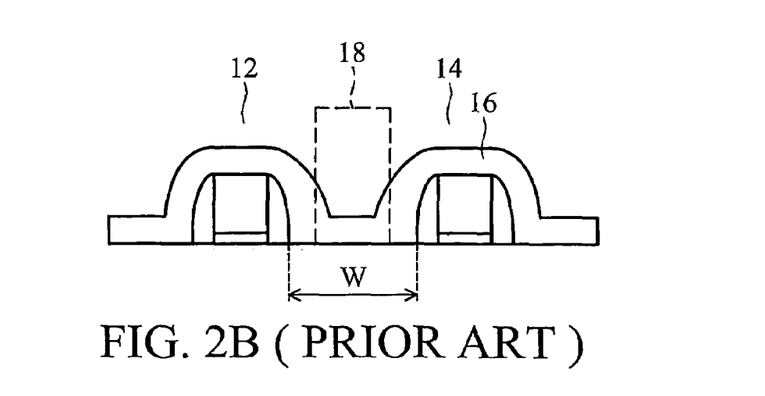

A further problem is explained using FIGS. 2A and 2B. Referring to FIG. 2A, two MOS devices 12 and 14 are formed adjacent each other. The gap between MOS devices 12 and 14 has a height H and a width W. A CESL 16 is formed over the MOS devices 12 and 14. The region 18 between the MOS devices 12 and 14 is available for forming contact plugs (not shown). Since CESL 16 inside region 18 is relatively flat, the subsequent contact-etch process, during which an inter-layer dielectric layer (not shown) and a CESL 16 are etched, is relatively easy.

If the distance between MOS devices 12 and 14 are decreased, as shown in FIG. 2B, the width W is also reduced. This causes a narrowing of the region 18. If a CESL 16 with a same thickness as in FIG. 2A is formed, the CESL 16 in region 18 will experience great thickness variation. As a result, the subsequent contact-etch process experiences difficulty, and over-etch may occur at one location and under-etching may occur at another. To reduce such an effect, the thickness of the CESL 16 is preferably reduced, which in turn limits the stress applied by CESL 16.

A semiconductor device that may overcome the previously discussed deficiencies of the prior art is thus needed.

SUMMARY OF THE INVENTION

In accordance with one aspect of the present invention, a semiconductor structure includes a substrate including a first region and a second region, a first MOS device in the first region wherein the first MOS device comprises a first spacer liner, and a second MOS device in the second region wherein the second MOS device comprises a second spacer liner. A first stressed film having a first thickness is formed over the first MOS device and directly on the first spacer liner. A second stressed film having a second thickness is formed over the second MOS device and directly on the second spacer liner.

In accordance with another aspect of the present invention, a ratio of the first thickness to the second thickness is between about 2 and about 25.

In accordance with yet another aspect of the present invention, the first and the second spacer liners have widths of between about 150 Å and about 800 Å.

In accordance with yet another aspect of the present invention, the second thickness has a ratio of between about 0.125 and about 7.5 to respective widths of the first and the second spacer liners.

In accordance with yet another aspect of the present invention, the first and the second stressed films comprise upper portions and lower portions having different materials, wherein the lower portions form a continuous layer.

In accordance with yet another aspect of the present invention, a method of forming a semiconductor structure includes providing a semiconductor substrate comprising a first region and a second region, forming a first gate stack over the first region and a second gate stack over the second region, forming a first spacer liner on a sidewall of the first gate stack and a second spacer liner on a sidewall of the second gate stack, and forming a contact etch stop layer (CESL) having a first portion over the first region and a second portion over the second region. The CESL is formed directly on the first and the second spacer liners. The first portion has a first thickness substantially greater than a second thickness of the second portion.

In accordance with yet another aspect of the present invention, a method of forming a semiconductor structure includes providing a semiconductor substrate comprising a first region and a second region, forming a first gate stack over the first region and a second gate stack over the second region, forming a first spacer liner on a sidewall of the first gate stack and a second spacer liner on a sidewall of the second gate stack, and forming a contact etch stop layer (CESL) having a first portion over the first region and a second portion over the second region. The CESL is on the first and the second spacer liners. The first portion has a first thickness substantially greater than a second thickness of the second portion.

With the spacers removed, the aspect ratio of the gap between neighboring MOS devices is reduced. Thus, the stresses applied by the CESL can be better applied to the channel regions of the respective MOS devices.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4 through 13 are cross-sectional views of intermediate stages in the manufacture of a preferred embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3:
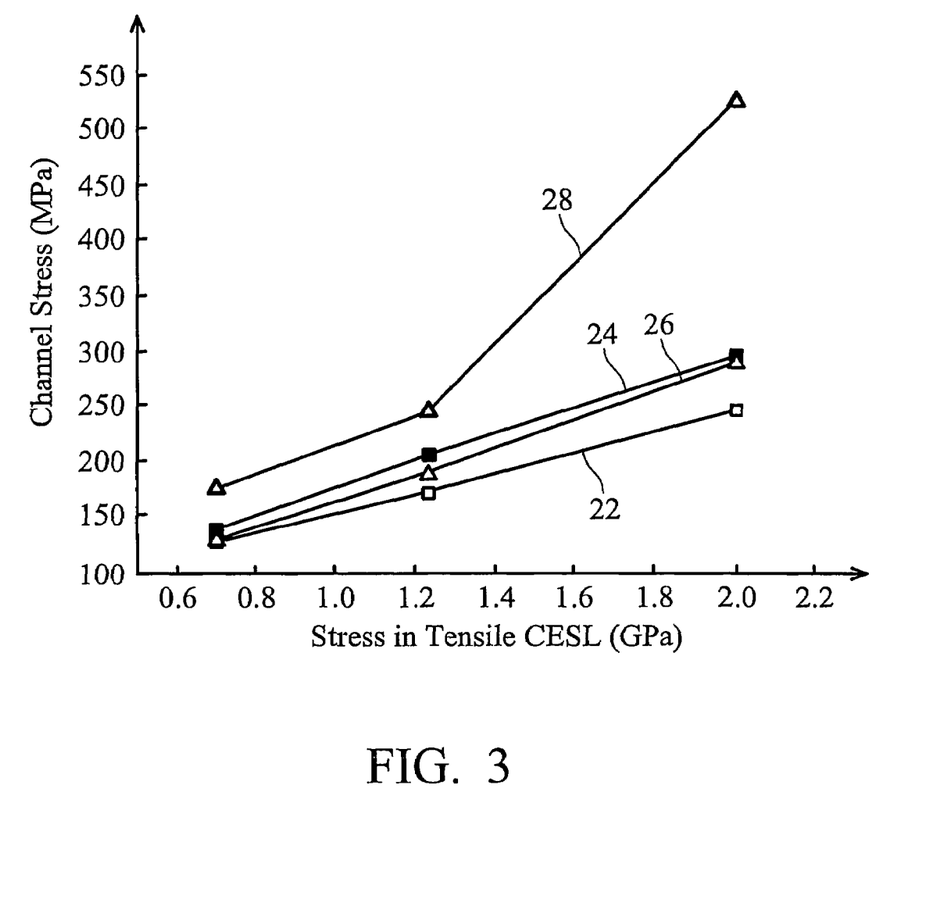
FIG. 3 illustrates stresses in the channel regions of MOS devices as a function of stresses in respective tensile contact etch stop layers.

Simulations have been performed to analyze the correlation between channel stress and gate spacers and contact etch stop layers (CESLs). The results are shown in FIG. 3, wherein channel stresses in the channel length direction are shown as a function of the inherent stresses in CESL layers. Lines 22 and 24 were obtained from MOS devices having spacers with a thickness of about 450 Å, wherein line 22 was obtained from MOS devices with 300 Å CESLs, and line 24 was obtained from MOS devices with 900 Å CESLs. Lines 26 and 28 were obtained from MOS devices with no spacers formed, wherein line 26 was obtained from MOS devices with 300 Å CESLs, and line 28 was obtained from MOS devices with 900 Å CESLs.

Comparing lines 22 and 24, it is found that a thicker CESL applies a greater stress to the channel region, as is already known in the art. The same conclusion may be drawn by comparing lines 26 and 28. Note that line 26 is higher than line 22, which indicates that when CESL layers have the same thicknesses (300 Å) and same stresses, greater stresses can be imparted to the channel region on MOS devices that have no spacers formed. Similarly, the same conclusion can be drawn by comparing lines 24 and 28.

Additionally, the value of line 28 increases in an unexpected scale over lines 22, 24 and 26, indicating that a very thin spacer (thickness is zero in this case) combined with a CESL having a great thickness is particularly beneficial for applying stress to the channel.

Based on the above-discussions, the preferred embodiments of the present invention are provided and illustrated in FIGS. 4 through 13. Variations of the preferred embodiments are then discussed. Throughout the various views and illustrative embodiments of the present invention, like reference numbers are used to designate like elements.

Figure 4:
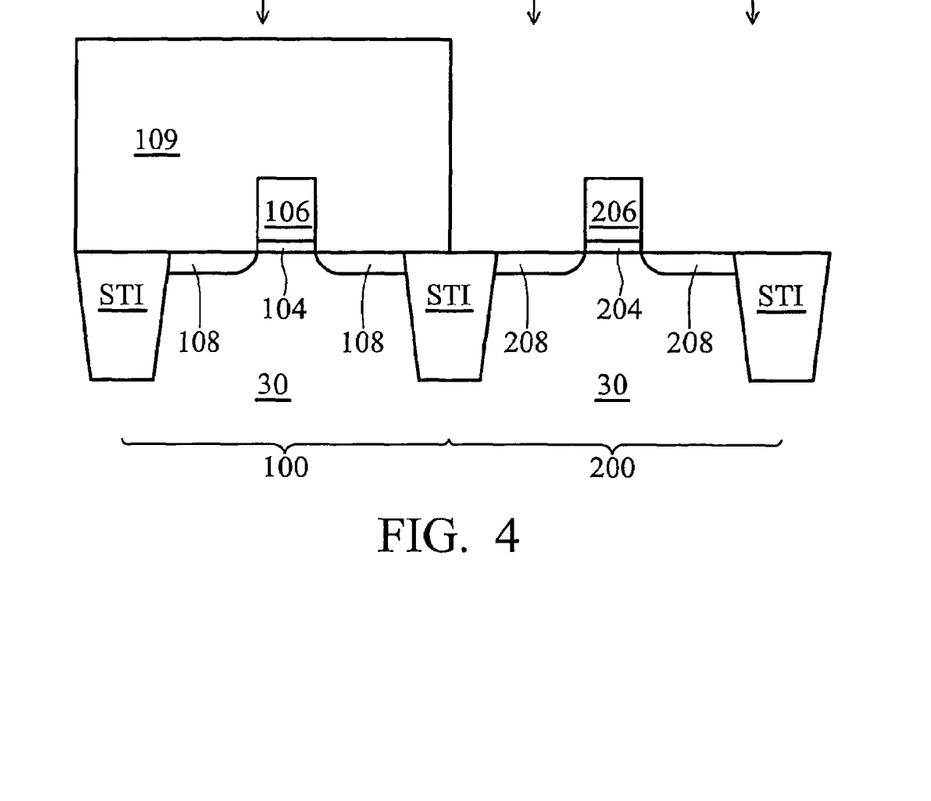

FIG. 4 illustrates a substrate 30 comprising two regions, a region 100 for forming an NMOS device and a region 200 for forming a PMOS device. Shallow trench isolation (STI) regions are formed in substrate 30 to isolate device regions 100 and 200. In the preferred embodiment, device regions 100 and 200 are closely located and adjoined by a STI region in between. In an alternative embodiment, device regions 100 and 200 are not closely located. Substrate 30 is preferably bulk silicon, but other commonly used materials and structures such as SiGe, silicon on insulator (SOI), SiGe on insulator, and strained silicon on insulator can also be used. A gate stack comprising a gate dielectric 104 and a gate electrode 106 is formed in NMOS region 100. Similarly, a gate stack comprising a gate dielectric 204 and a gate electrode 206 is formed in PMOS region 200.

Lightly doped drain/source (LDD) regions 108 and 208 are then formed. Preferably, a photo resist 109 is formed and patterned, masking NMOS region 100. PMOS region 200 is then implanted with a p-type impurity such as boron, and LDD regions 208 are formed. Photo resist 109 is then removed. Similarly, NMOS region 100 may be implanted with an n-type impurity, forming LDD regions 108. During the n-type implantation, PMOS region 200 is masked by a photo resist (not shown).

Figure 5:
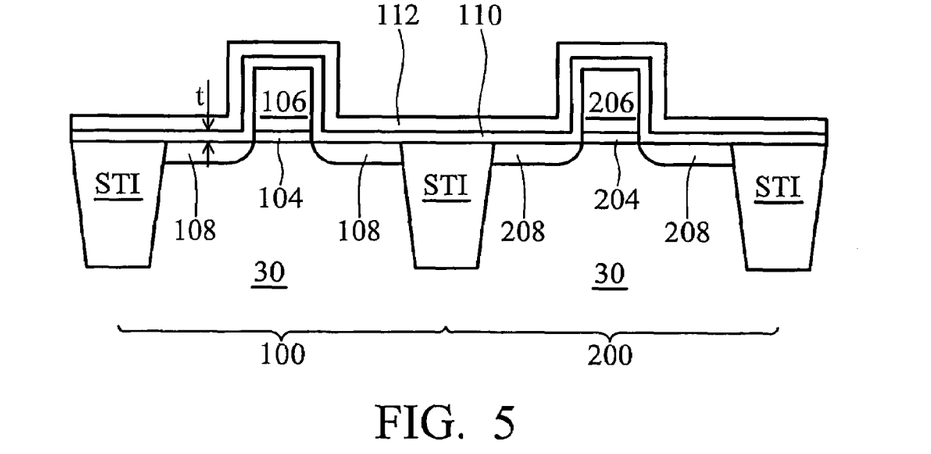

A dummy layer is then formed over NMOS region 100 and PMOS region 200, as illustrated in FIG. 5. In the preferred embodiment, the dummy layer is a composite layer comprising a first sub-layer 110 and a second sub-layer 112. The sub-layers are preferably formed of materials having different etching characteristics, such as silicon oxide, silicon nitride, silicon oxynitride (SiON), and the like. The formation of the sub-layers may be performed using commonly used techniques, such as plasma enhanced chemical vapor deposition (PECVD), low-pressure chemical vapor deposition (LPCVD), sub-atmospheric chemical vapor deposition (SACVD), etc. In an exemplary embodiment, sub-layer 110 is a liner oxide layer and sub-layer 112 is a nitride layer. Preferably, sub-layer 110 has a thickness of less than about 250 Å, and more preferably between about 30 Å and about 250 Å, and even more preferably between about 30 Å and about 100 Å.

Figure 6:
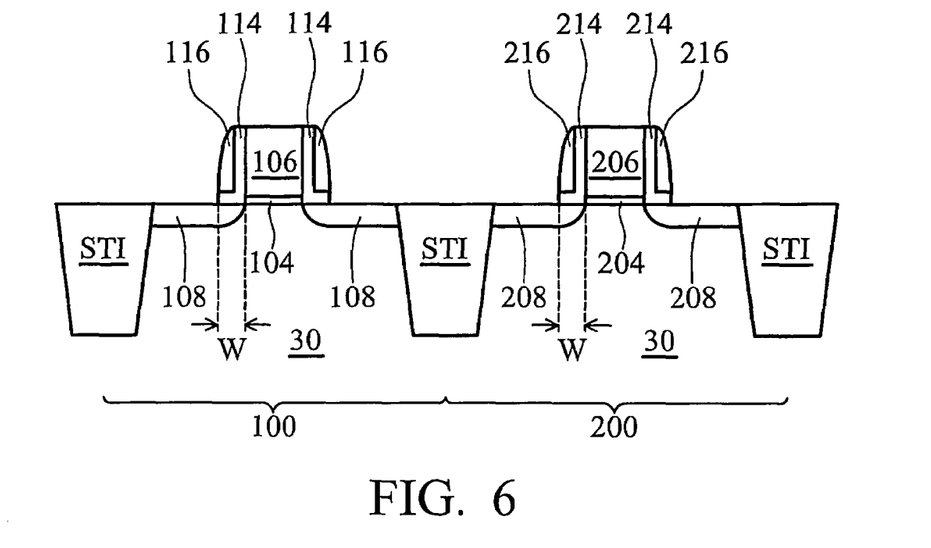

FIG. 6 illustrates the patterning of sub-layer 110 and sub-layer 112. Either wet etching or dry etching may be used for patterning. The remaining portions of the sub-layer 110 and sub-layer 112 form spacer liner 114 and spacer 116 in region 100, and spacer liner 214 and spacer 216 in region 200, respectively. The width W of the spacer liners is preferably between about 150 Å and about 800 Å.

Figure 7A:
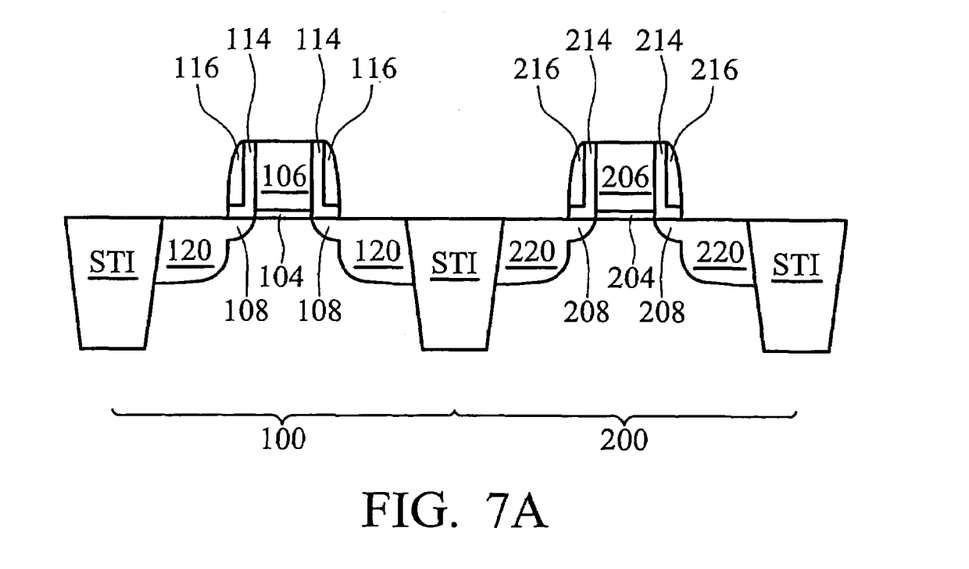

FIG. 7A illustrates the formation of the source/drain regions 120 and 220. As is known in the art, source/drain regions 120 and 220 may be recessed in or elevated above the substrate 30 (using, e.g., epitaxially grown regions). In the preferred embodiment, source/drain regions 120 and 220 are formed by implanting impurities into semiconductor substrate 30. The respective spacers 116 and 216 are used as masks so that the edges of the source/drain regions 120 and 220 are substantially aligned with the respective spacers. Gate electrodes 106 and 206 are preferably implanted simultaneously with the respective source/drain regions to reduce sheet resistance. When region 100 is implanted with an n-type impurity, region 200 is masked by a photo resist (not shown). Similarly, when region 200 is implanted with a p-type impurity, region 100 is masked by a photo resist (not shown).

Figure 7B:
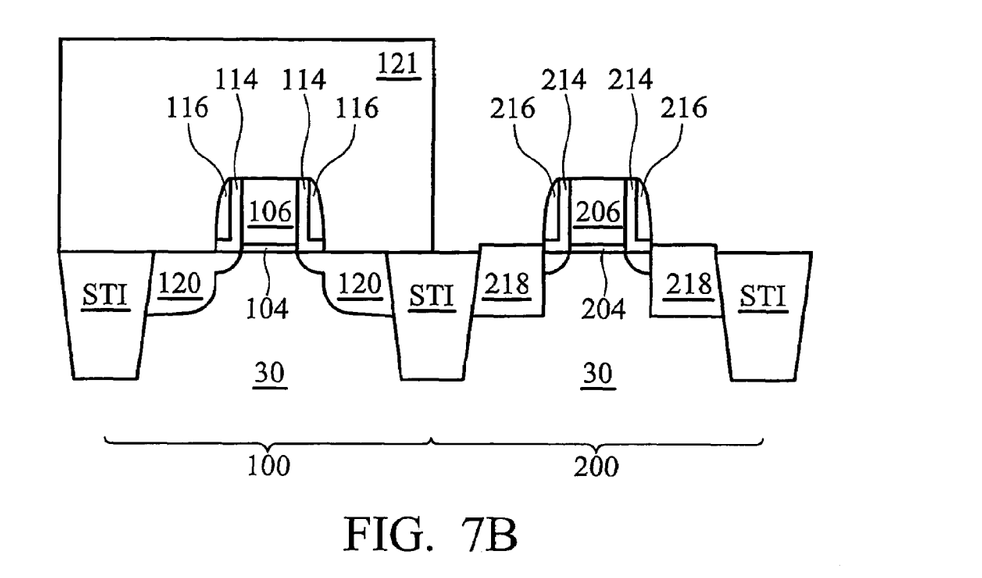

In alternative embodiments, as shown in FIG. 7B, SiGe stressors 218 are formed in PMOS region 200. Preferably, a photo resist 121 is formed covering NMOS region 100. Recesses are formed in substrate 30 along the outside edges of the spacers 216, preferably by etching. SiGe stressors 218 are then formed in the recesses. In the preferred embodiment, SiGe stressors 218 are epitaxially grown. P-type impurities such as boron are preferably doped during the epitaxial growth. The photo resist 121 is then removed. After being annealed, SiGe stressors 218 will try to restore their lattice spacing, which is greater than the lattice spacing of the substrate 30. This introduces compressive stresses in the respective channel regions of the resulting PMOS devices, and the device drive currents of the respective PMOS devices are increased.

Figure 8:
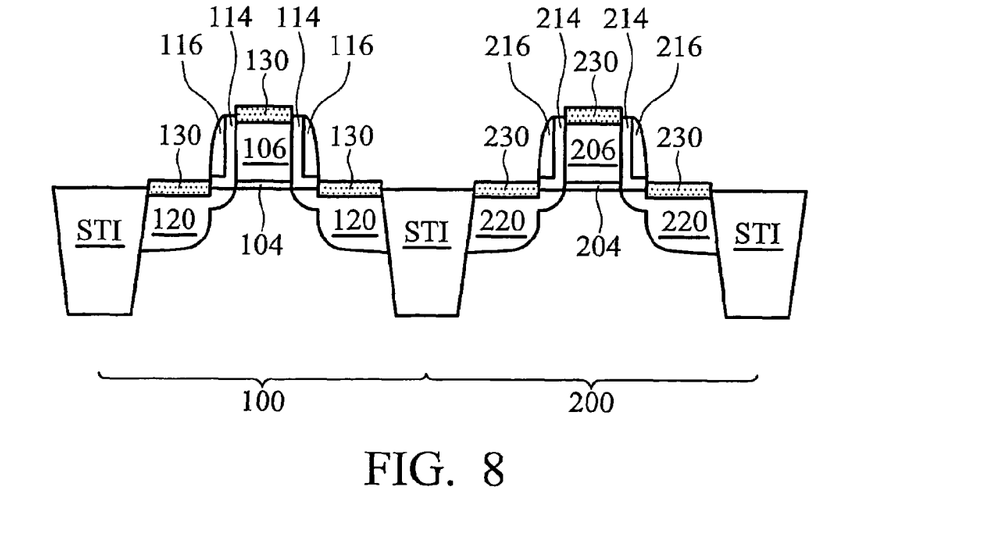

FIG. 8 illustrates the structure after the formation of silicide regions 130 and 230. As is known in the art, silicide regions 130 and 230 may be formed by salicide processes on the respective source/drain regions and gate electrodes. To form a silicide layer, a metal layer is preferably formed by first depositing a thin layer of metal, such as cobalt, nickel, titanium, and the like, over the device. The device is then annealed to form a silicide between the deposited metal and the underlying exposed silicon regions. Un-reacted metal is then removed.

Figure 9:
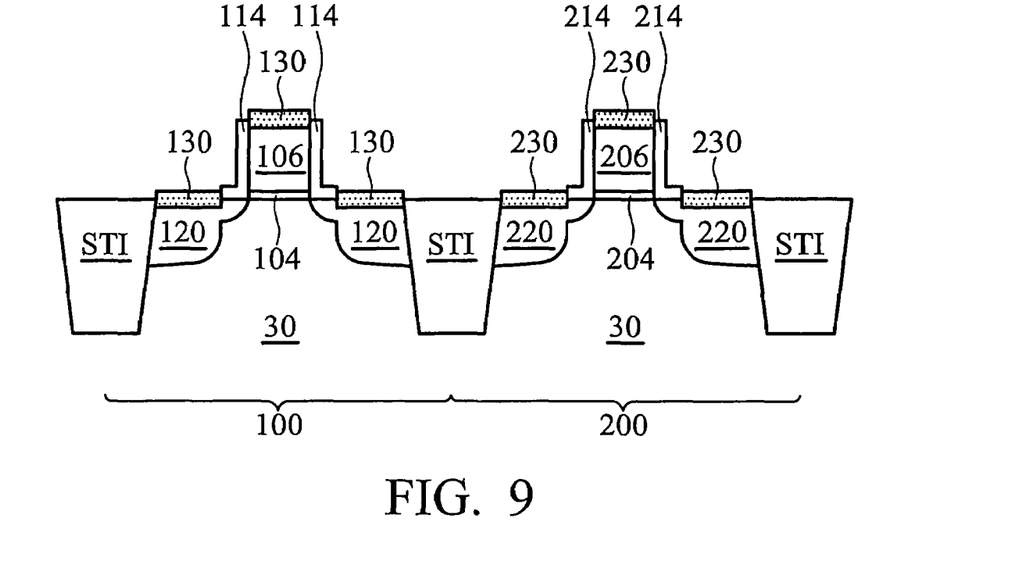

Referring to FIG. 9, spacers 116 and 216 are removed. Both wet and dry etchings can be used. The removal is preferably performed using an etchant that attacks the spacers 116 and 216, but not the spacer liners 114 and 214 and silicides 130 and 230. In the preferred embodiment wherein the spacers 116 and 216 are formed of silicon nitride and spacer liners 114 and 214 are formed of silicon oxide, HF and/or $H_3PO_4$ can be used to remove spacers 116 and 216.

Figure 10:
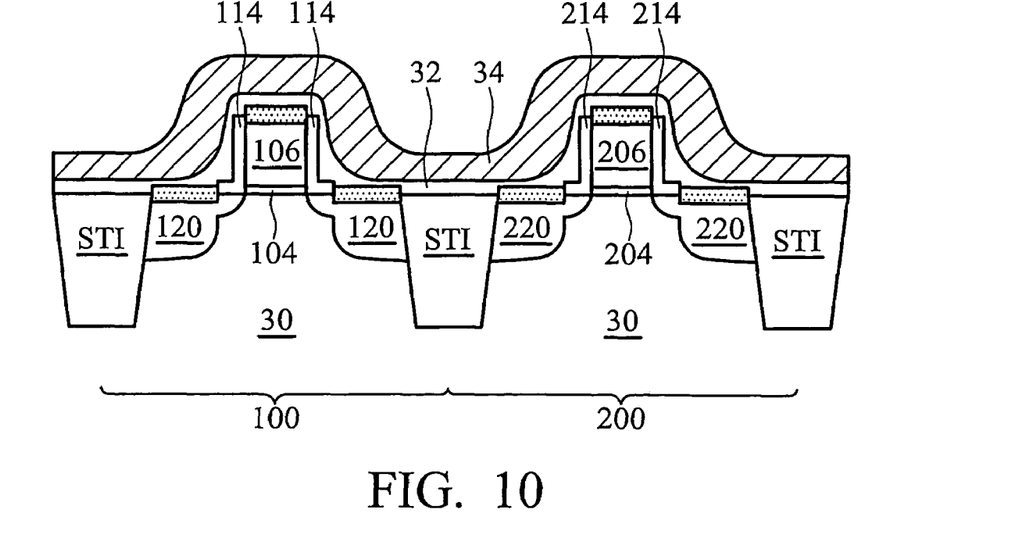

Referring to FIG. 10, a dielectric layer 32 is optionally formed. A contact etch stop layer (CESL) 34 is then formed. Dielectric layer 32 acts as an etch stop layer for CESL 34, and the reason is discussed in subsequent paragraphs. Preferably, dielectric layer 32 has a thickness of between about 50 Å and about 250 Å, and CESL 34 has a thickness of between about 300 Å and about 1500 Å. According to the type of MOS device to be formed, appropriate materials and correspondent formation processes are selected for CESL 34 to apply either compressive or tensile strain to the channel region of the device. Preferably, the materials of CESL 34 include commonly used materials such as nitride, oxynitride, oxide, SiC, SiON, and combinations thereof. Dielectric layer 32 preferably comprises materials such as oxide, nitride, oxynitride, and the like. More preferably, dielectric layer 32 and CESL 34 comprise different materials having different etching characteristics.

Figure 11A:
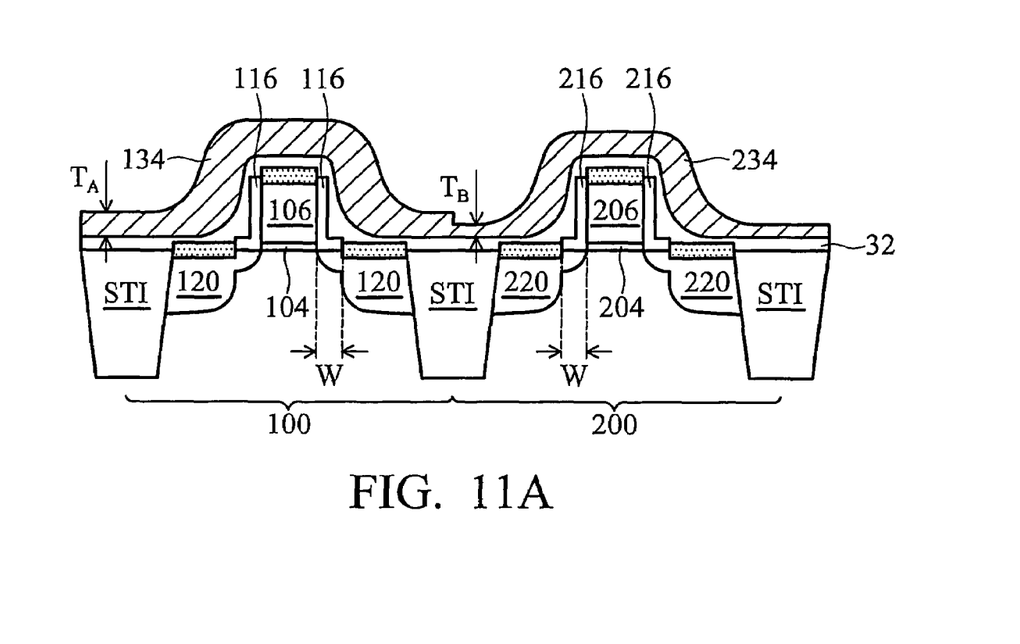

In the preferred embodiment, as shown in FIG. 11A, CESL 34 in region 200 is thinned, and the remaining portion in regions 100 and 200 are denoted as 134 and 234, respectively. Preferably, the remaining portion 234 has a thickness of less than about 500 Å, and more preferably between about 50 Å and about 300 Å. A ratio of thickness TA of CESL 134 to thickness TB of CESL 234 is preferably between about 2 and 25, and more preferably between about 3 and 9. A ratio of the thickness TA or TB to the width W of the spacer liners 114 and 214 is preferably between about 0.125 and about 7.5, and more preferably between about 0.3 and 4. In this embodiment, the dielectric layer 32 and CESL 34 preferably have inherent tensile stresses. As a result, a tensile stress is applied to the channel region of the resulting NMOS device, so that the NMOS device is improved. Since PMOS device (region 200) prefers a compressive stress, the CESL 234 is thinner compared to CESL 134. Thus less tensile stress is applied by the CESL 234, and the detrimental effect is reduced. In this embodiment, CESL 134 may be very thick due to its high ratio of its thickness to the thickness of CESL 234. The removal of spacer 116 (refer to FIG. 8) makes the thick CESL possible.

Figure 11B:
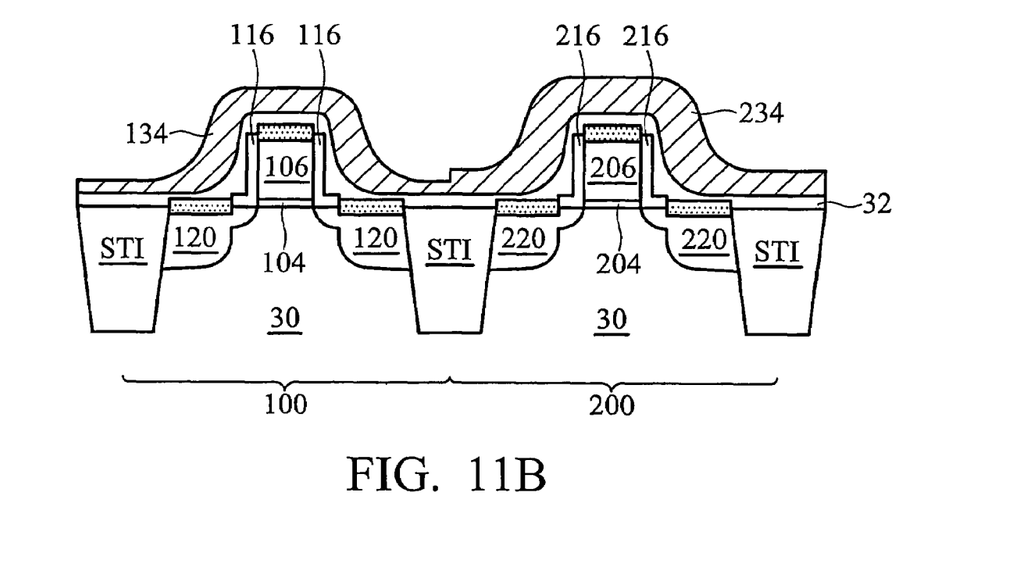

In other embodiments, as shown in FIG. 11B, CESL 34 in region 100 is thinned. In this embodiment, the dielectric layer 32 and CESL 34 preferably have inherent compressive stresses. As a result, a compressive stress is applied to the channel region of the resulting PMOS device, so that the PMOS device is improved. Since NMOS device (region 100) prefers a tensile stress, CESL 134 is preferably thinner compared to CESL 234, thus a smaller compressive stress is applied to the channel region of the NMOS device, and the detrimental effect is reduced.

Typically, the performance of PMOS devices can be easily improved with SiGe stressors, while the performance of NMOS devices is relatively difficult to improve, thus the embodiment shown in FIG. 11A is more preferable.

Figure 12:
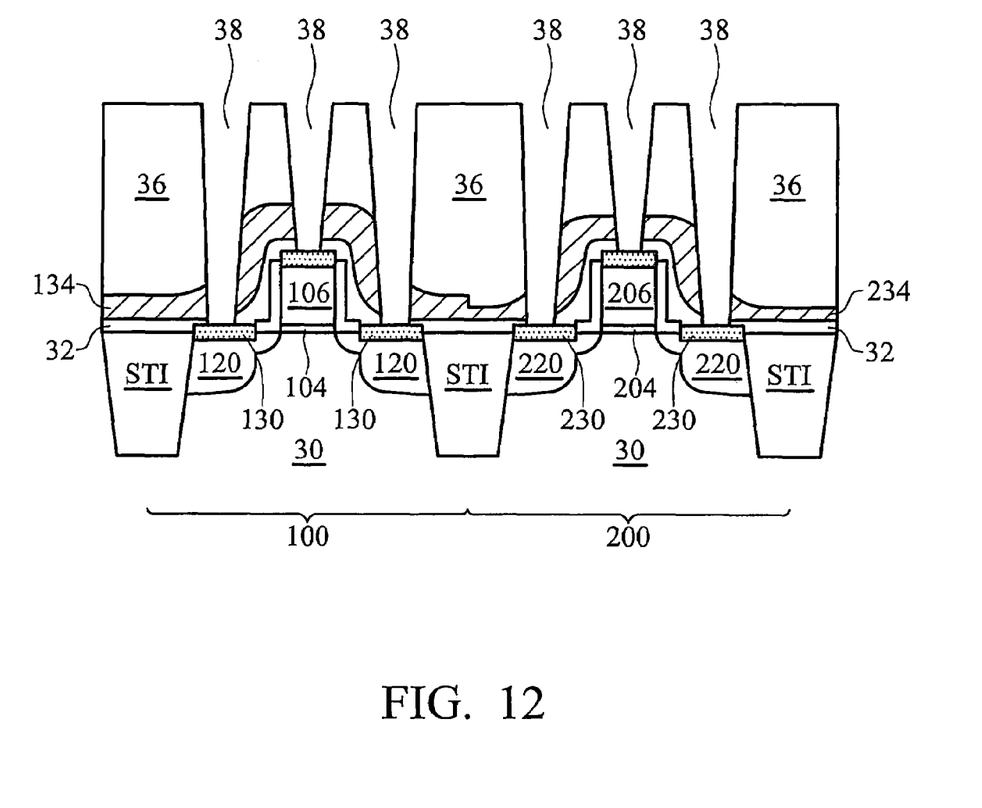
Figure 13:
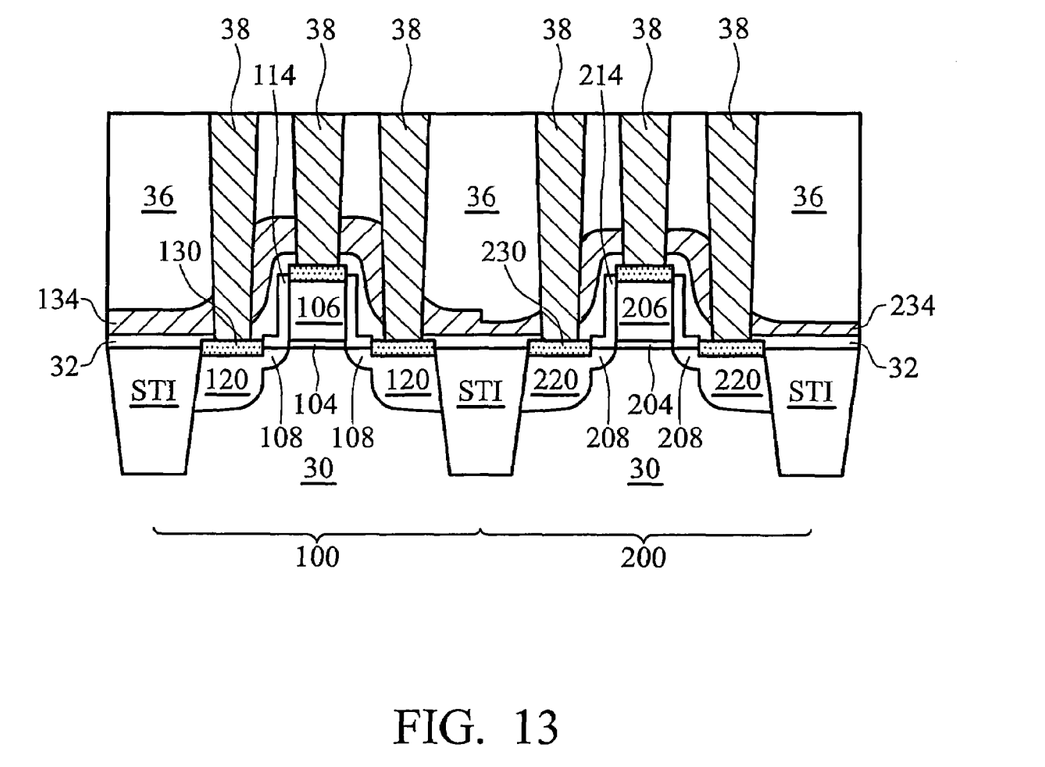

FIG. 12 illustrates the formation of an inter-layer dielectric (ILD) layer 36 and contacts openings 38. Since CESLs 134 and 234 may have significantly different thicknesses, the dielectric layer 32 preferably acts as an etch stop layer for etching CESLs 134 and 234. Dielectric layer 32 is then etched, exposing the underlying silicide regions 130 and 230. Since dielectric layer 32 is thin, the etch process can be better controlled. Contact openings 38 are then filled with conductive materials, forming contacts 40. The resulting structure is shown in FIG. 13.

Figure 14:
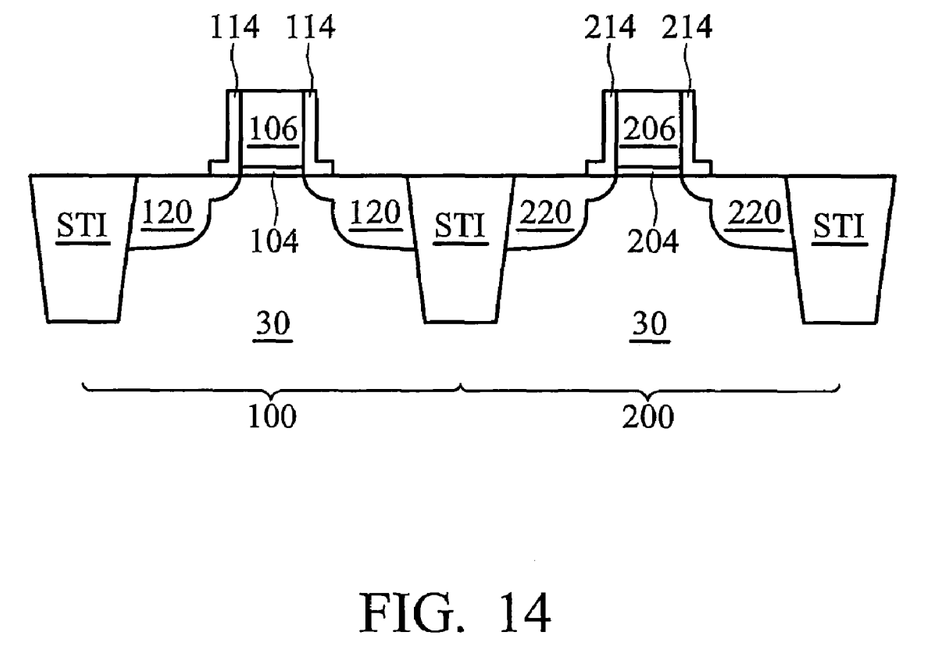
FIG. 14 illustrates an intermediate stage in the manufacture of a variation of the preferred embodiment.

FIG. 14 illustrates a variation of the preferred embodiment. The initial steps of this embodiment are similar to what is shown in FIGS. 4 through 7B. After the formation of source/drain regions 120 and 220 but before the formation of silicide regions 130 and 230, the spacers 116 and 216 are removed using an etchant attacking spacers 116 and 216, but not spacer liners 114 and 214 and substrate 30. In an exemplary embodiment, the spacer liners 114 and 214 are formed of silicon oxide and the spacers 116 and 216 are formed of silicon nitride. Accordingly, spacers 116 and 216 are removed using HF and/or $H_3PO_4$. After the removal of spacers 116 and 216, silicide regions 130 and 230 are formed, resulting in a structure shown in FIG. 9.

Figure 15A:
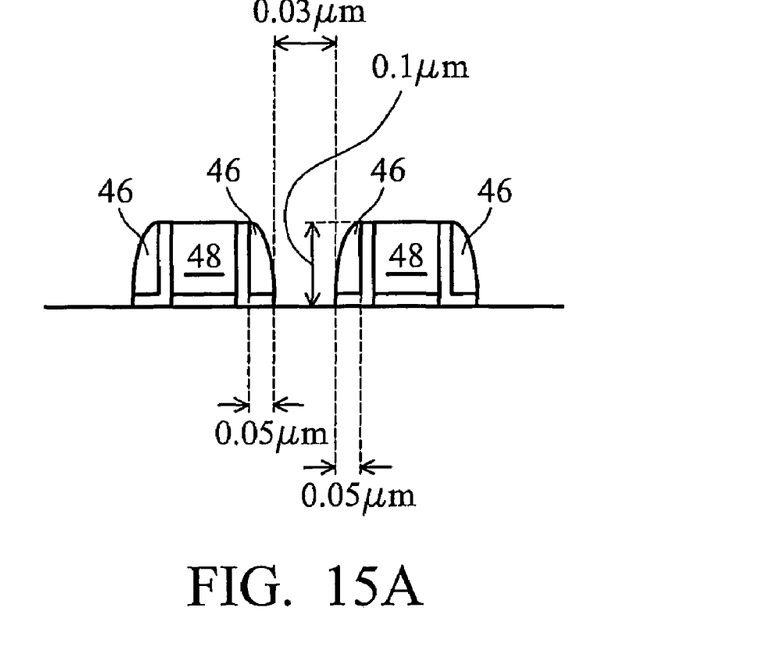
FIGS. 15A and 15B illustrate the improvement in gap-filling by using the preferred embodiment of the present invention.
Figure 15B:
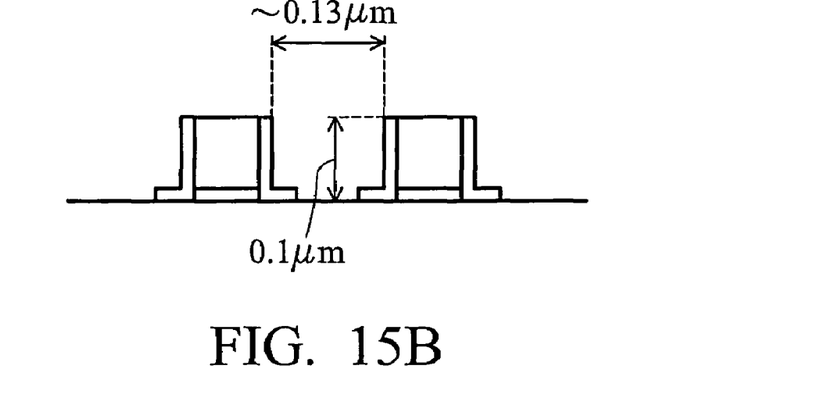

The preferred embodiments of the present invention have several advantageous features. An example is shown in FIGS. 15A and 15B to explain the improvement of the aspect ratio. Referring to FIG. 15A, assuming the spacers have a thickness of 0.05 µm, and the spacing between spacers is 0.03 µm, and further assuming the height of the gates is 0.1 µm, the aspect ratio is 0.1/0.03, which is about 3.3. By removing spacers (refer to FIG. 15B), the spacing is increased to close to 0.13 µm, and the aspect ratio is reduced to 0.8.

The preferred embodiments of the present invention are preferably used in integrated circuits having small spacing, for example, the spacing between the gate electrodes of neighboring MOS devices is less than about 3000 Å. By reducing the aspect ratio, gap-filling is improved and the contact etching process can be better controlled. Additionally, thicker CESLs can be applied without causing difficulty in subsequent processes, so that the performance of devices is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   providing a semiconductor substrate comprising a first region and a second region;
   forming a first gate stack over the first region and a second gate stack over the second region;
   implanting the semiconductor substrate to form a lightly doped source/drain (LDD) region;
   after the step of implanting the semiconductor substrate, blanket forming a spacer liner layer;
   blanket forming a spacer layer on the spacer liner layer;
   patterning the spacer liner layer to form a first and a second spacer liner having L-shapes;
   patterning the spacer layer to form a first spacer over the first spacer liner and a second spacer over the second spacer liner;
   removing the first and the second spacers; and
   forming a contact etch stop layer (CESL) having a first portion over the first region and a second portion over the second region, wherein the CESL is directly on the first and the second spacer liners, and wherein the first portion has a first thickness substantially greater than a second thickness of the second portion.

2. The method of claim 1 further comprising forming an isolation region in the semiconductor substrate and adjoining the first and the second regions.

3. The method of claim 1, wherein the step of forming the CESL comprises: blanket forming a CESL; and
   thinning a portion of the CESL over the second region.

4. The method of claim 1 wherein the step of forming the CESL comprises forming a first sub-layer and a second sub-layer comprising a different material from the first sub-layer.

5. A method of forming a semiconductor structure, the method comprising:
   providing a semiconductor substrate comprising a first region and a second region;
   forming a first gate stack over the first region and a second gate stack over the second region;
   implanting the semiconductor substrate to form a lightly doped source/drain (LDD) region;
   after the step of implanting the semiconductor substrate, forming a first spacer liner on a sidewall of the first gate stack;
   forming a second spacer liner on a sidewall of the second gate stack;
   forming a first spacer on a horizontal leg of the first spacer liner;
   forming a second spacer on a horizontal leg of the second spacer liner;
   removing the first and the second spacers;
   forming suicide regions on source/drain regions;
   forming a CESL over the first and the second regions; and
   partially thinning a portion of the CESL over the second region.

6. The method of claim 5 further comprising forming a dielectric layer over the first and the second regions and on the first and the second spacer liners before the step of forming the CESL, wherein the dielectric layer comprises a different material from the CESL.

7. The method of claim 6 wherein the dielectric layer has a thickness of between about 50 Å and about 250 Å.

8. The method of claim 5, wherein the first and the second spacers are removed before the step of forming the silicide regions.

9. The method of claim 5, wherein the first and the second spacers are removed after the step of forming the silicide regions.

10. The method of claim 5, wherein the CESL over the first region has a first thickness, a remaining portion of the CESL over the second portion has a second thickness, and wherein the first thickness and the second thickness have a ratio of between about 2 and about 25.

11. The method of claim 5, wherein source/drain regions in the first region are of n-type, the source/drain regions in the second region are of p-type, and wherein the CESL has an inherent tensile stress.

12. The method of claim 5, wherein the first and the second spacer liners have a thickness of between about 30 Å and about 250 Å and a width of between about 150 Å and about 800 Å.

* * * * *

UNITED STATES PATENT AND TRADEMARK OFFICE
CERTIFICATE OF CORRECTION

PATENT NO. : 7,378,308 B2 Page 1 of 1
APPLICATION NO. : 11/393369
DATED : May 27, 2008
INVENTOR(S) : Hsu et al.

It is certified that error appears in the above-identified patent and that said Letters Patent is hereby corrected as shown below:

In Col. 7, line 32, after comprises: insert new paragraph return.
In Col. 8, line 12, delete "suicide" and insert --silicide--.

Signed and Sealed this

Twelfth Day of August, 2008

JON W. DUDAS
*Director of the United States Patent and Trademark Office*